(12) United States Patent
Jiang

(10) Patent No.: US 6,765,652 B1
(45) Date of Patent: *Jul. 20, 2004

(54) FORMING THERMALLY CURABLE MATERIALS ON A SUPPORT STRUCTURE IN AN ELECTRONIC DEVICE

(75) Inventor: Tongbi Jiang, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 789 days.

(21) Appl. No.: 09/005,895

(22) Filed: Jan. 12, 1998

(51) Int. Cl.[7] .......................... G03B 27/00; B23K 31/02
(52) U.S. Cl. .................... 355/405; 228/180.22
(58) Field of Search .......................... 355/405; 428/64, 428/65.1; 156/153, 275.5, 275.7; 29/840, 180.5; 228/180.1, 180.22, 180.5, 254; 438/613

(56) References Cited

U.S. PATENT DOCUMENTS

| | | | |
|---|---|---|---|
| 3,835,531 A | | 9/1974 | Luttmer ........................ 29/625 |
| 4,172,907 A | | 10/1979 | Mones et al. .................. 427/96 |
| 4,659,872 A | * | 4/1987 | Dery et al. ................... 174/117 |
| 5,128,746 A | | 7/1992 | Pennisi et al. ................. 357/72 |
| 5,286,679 A | | 2/1994 | Farnworth et al. ........... 437/209 |
| 5,312,663 A | * | 5/1994 | Kosinski et al. ............... 428/64 |
| 5,394,609 A | * | 3/1995 | Ferguson et al. .............. 29/840 |
| 5,438,020 A | * | 8/1995 | Grancher et al. ......... 228/180.5 |
| 5,501,755 A | * | 3/1996 | Dahlquist .................... 156/153 |
| 5,545,281 A | | 8/1996 | Matsui et al. ............. 156/273.7 |
| 5,653,017 A | | 8/1997 | Cathey et al. ................ 39/830 |
| 5,985,043 A | * | 11/1999 | Zhou et al. .................... 148/24 |
| 5,988,487 A | * | 11/1999 | MacKay et al. ............. 228/254 |
| 6,107,122 A | * | 8/2000 | Wood et al. ................. 438/117 |

OTHER PUBLICATIONS

Michael Pecht, Intergrated Circuit, Hybrid, and Multichip Module Package Design Guidelines: A Focus on Reliability, pp. 183–224 (1994).

Charles A. Harper, Electronic Packaging & Interconnection Handbook, pp. 10.29–10.34 (2D Ed., 1997).

* cited by examiner

*Primary Examiner*—Peter B. Kim
(74) *Attorney, Agent, or Firm*—Trop, Pruner & Hu, P.C.

(57) ABSTRACT

A thermally curable material (including a conductive adhesive or solder) is formed on an electronic device support structure such as a die on a wafer or a printed wiring board (PWB). The support structure is placed on a heatable surface or placed in a process chamber having an infrared radiation (IR) mechanism. The thermally curable material is formed using a dispensing technique such as screen printing or pneumatic dispensing. To heat the curable material to a temperature sufficient to cure, the heatable surface can be heated or the IR mechanism can be activated. The heatable surface can be located in a screen printing machine.

18 Claims, 4 Drawing Sheets

FORMING THERMALLY CURABLE MATERIALS ON A SUPPORT STRUCTURE IN AN ELECTRONIC DEVICE

BACKGROUND

The invention relates to forming thermally curable materials on a support structure in an electronic device.

Electronic packaging (including packaging of one or more dies into an integrated circuit housing; packaging chips into multichip modules; and attaching chips onto a printed wiring board or PWB) involves forming thermally curable materials on the underlying support structure (which can be a wafer, PWB, leadframe, or other support surface). After formation of the thermally curable material, such as by screen printing, the material is cured to properly bond the material to the surface of the support structure.

For example, to attach chips to a PWB or other support surface, solder or a conductive adhesive can be deposited onto the support surface through a screen in a screen printing machine. After the solder or conductive adhesive has been formed, the support surface is removed from the screen printing machine and placed in an oven to cure the solder or conductive adhesive at high temperatures.

Another process that involves formation of a thermally curable material onto a support surface is flip-chip bonding, in which an unpackaged die is mounted directly onto a support structure (also referred to as an interconnecting substrate). The unpackaged die is turned upside down and bonded to the interconnecting substrate by some connecting medium, including solder bumps and conductive adhesives that contains polymers such as metal-filled epoxies or conductive thermoplastic compounds.

Flip-chip bonds provide a high density, low inductance direct electrical path between the die and the interconnecting substrate. Referring to FIG. 1, a typical flip-chip assembly is shown. An interconnecting substrate 10 has a surface 18 that provides conductive terminals 12. To prevent bonding material from flowing in the region between conductive terminals 12, solder dams 14 are mounted on the interconnecting substrate 10 between adjacent terminals 12.

A die 16 for mounting to the interconnecting substrate 10 is flipped over so that its active surface 21 faces the top surface 18 of the interconnecting substrate. Bumps 20 (solder or adhesives) are formed on bond pads 22 (typically made of aluminum) on the surface 21 of the die 16. As shown by the enlarged cross-sectional portion of the die 16, a window is cut through a passivation layer 24 over each bond pad 22 so electrical contact can be made. One or more thin circular layers 26 are formed over the exposed surface of the bond pad 22. Next, solder bumps or conductive polymer bumps 20 are formed over the circular layers 26, using such dispensing techniques as screen printing or pneumatic dispensing.

Typically, the formation of the layers 26 and bumps 20 is performed on an entire wafer, which includes multiple dies. After the layers 26 and bumps 20 are formed, one or more wafers are placed inside an oven to enable the bumps 20 to bond to the layers 26. Solder bump connections are made using a reflow process, which takes the plated solder through a solid-liquid-solid transition, allowing the solder to bond with the layers 26. If thermoset conductive polymers such as metal-filled epoxy are used, then the oven heating cures the thermoset polymer so bonding can occur.

Next, the wafer is sawed into individual dies. Each die 16 is placed onto the interconnecting substrate 10 such that the bumps 20 contact corresponding conductive terminals 12 on the interconnecting substrate 10.

In the typical manufacturing processes described above, support surfaces (wafers, PWBs, etc.) are physically removed from a screen printing or pneumatic dispensing machine and loaded into an oven to cure the deposited thermally curable material, which can be labor-intensive and time-consuming.

SUMMARY

Generally, the invention is directed to formation of a thermally curable material on an electronic device support structure that is placed on a heatable surface. Curing of the thermally curable material can then be performed by heating the heatable surface.

The invention has one or more of the following advantages. Using an in-line process to form thermally curable material on a support structure followed by thermally curing the material, steps in the manufacturing process are reduced. By eliminating the need to physically move support structures from one system to another system, first to deposit a thermally curable material and subsequently to cure the material, time and labor can be saved.

In general, in one aspect, the invention features a method of forming a thermally curable material on a support structure in an electronic device. The method includes placing the support structure on a heatable surface, and depositing the thermally curable material onto a surface of the support structure. The heatable surface is then heated to a temperature sufficient to cure the deposited material.

In general, in another aspect, the invention features a method of forming bumps on bond pads on a die. The die is placed on a heatable surface. Thermally curable bumps are formed on the bond pads. The heatable surface is heated to a temperature sufficient to cure the bumps.

In general, in another aspect, the invention features a method of fabricating a flip-chip assembly. A thermally curable material is deposited onto bond pads on a die placed on a heatable surface. The heatable surface is then heated to a sufficient temperature to cure the thermally curable material. The die is face mounted onto an interconnecting structure by connecting the cured material on the die bond pads to corresponding terminals on the interconnecting structure.

In general, in another aspect, the invention features a method of forming structures on a semiconductor die. A thermally curable material is screen printed onto bond pads of the die using a screen printing machine. The thermally curable material is heated in the screen printing machine to a temperature sufficient to cure the material.

In general, in another aspect, the invention features a screen-printing system including a member for holding an electronic device support structure, the member capable of being heated. The screen printing system further includes a screen through which a thermally curable material can be deposited onto portions of the support structure. The heated member is adapted to cure the material after deposition of the thermally curable material onto the support structure.

In general, in another aspect, the invention features an apparatus for forming a predetermined pattern on an electronic device support structure using a thermally curable material. A device is configured to deposit the material onto the support structure. A heatable surface on which the support structure is positioned is heated to a temperature sufficient to cure the material.

Other features and advantages will become apparent from the following description and from the claims.

DETAILED DESCRIPTION

Figure 1:
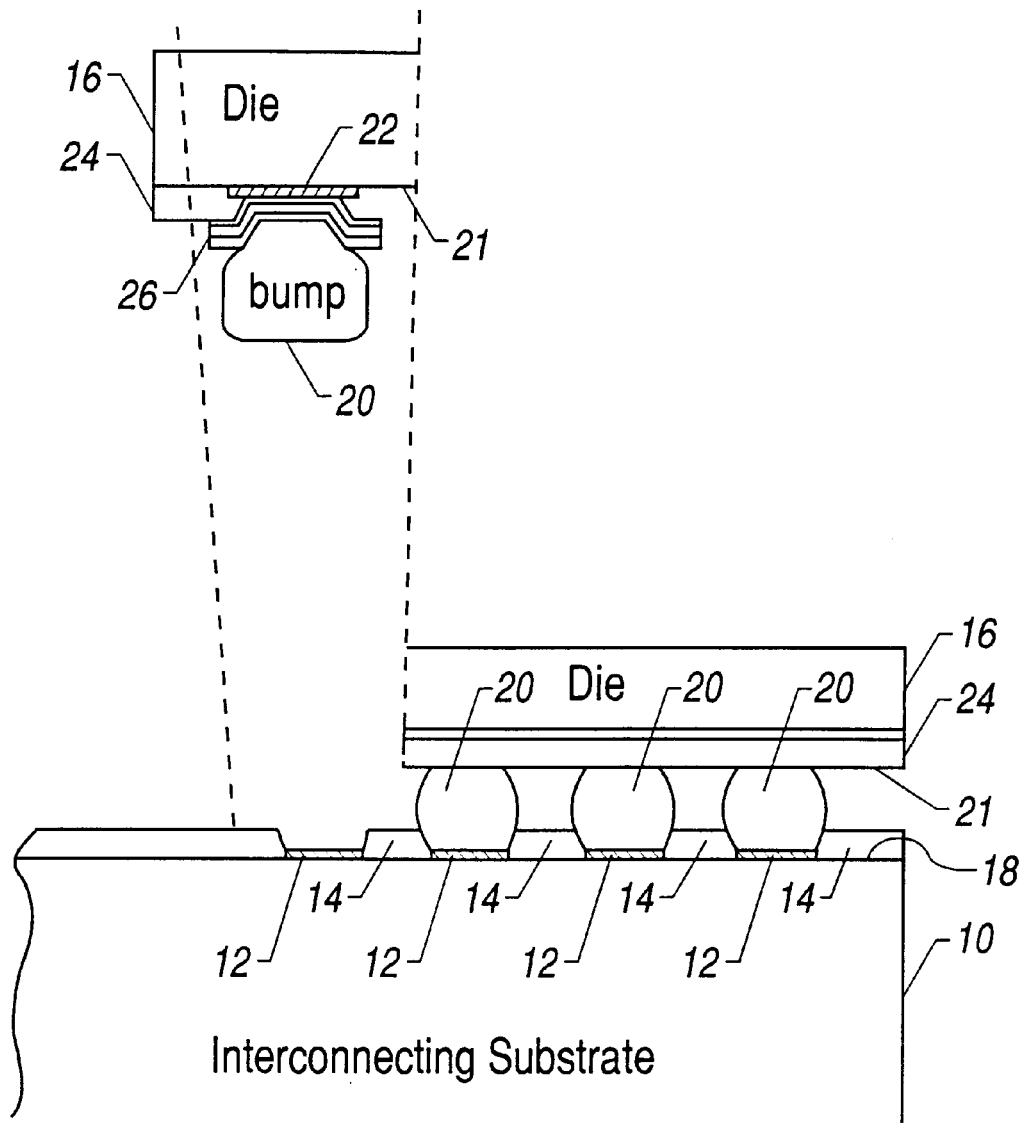
FIG. 1 is an enlarged, cross-sectional view of a flip-chip assembly.
Figure 2:
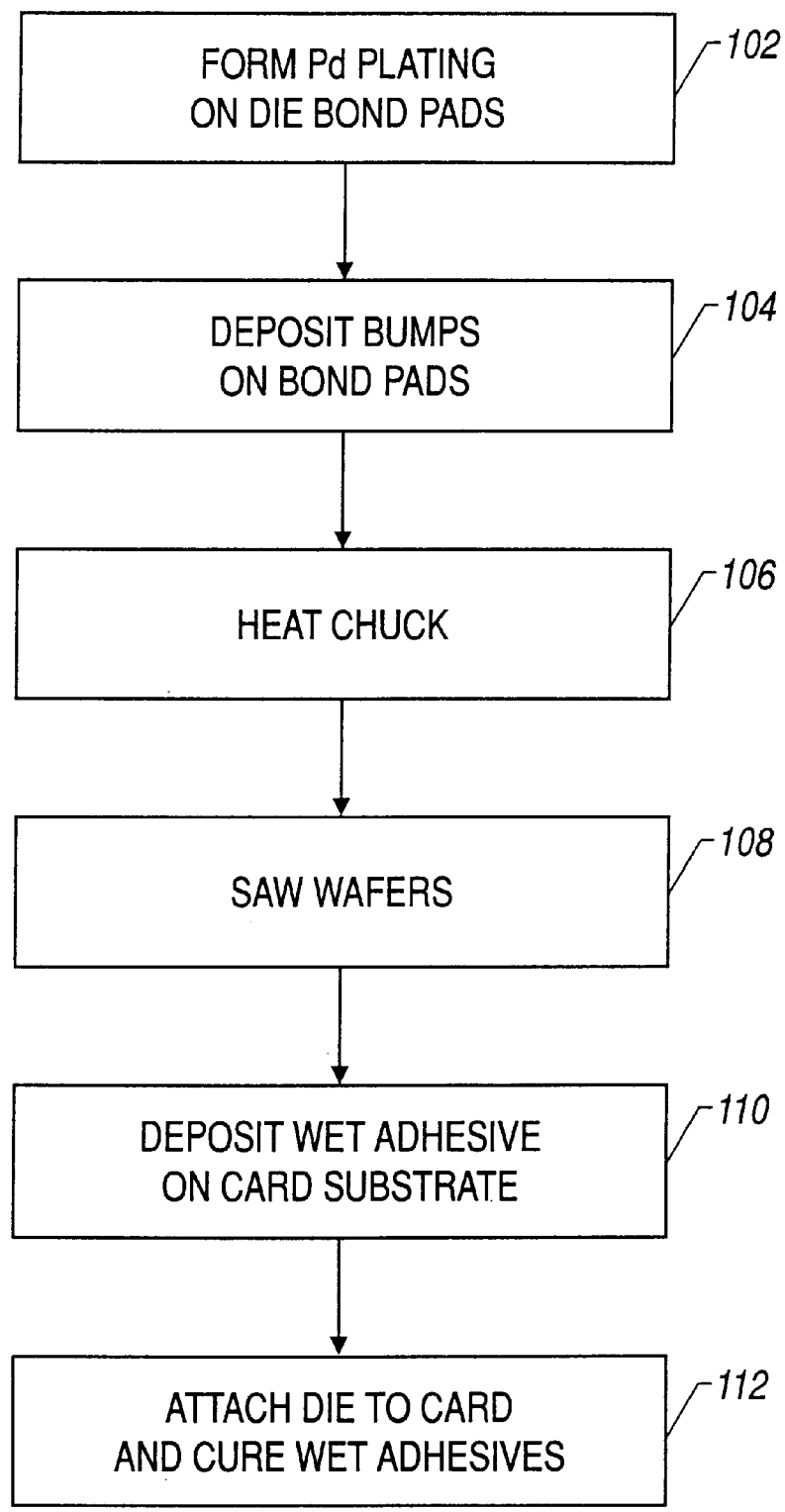
FIG. 2 is a flow diagram of the process for manufacturing a flip-chip assembly according to the invention.

Referring to FIG. 2, an improved process is illustrated for building a flip-chip assembly (shown in FIG. 1). First, one or more plated layers 26, including, e.g., a palladium (Pd) layer, are formed on the exposed area (through a window in the passivation layer 24) of aluminum bond pads 22 on the die 16 (step 102). The Pd plating can be used to enhance bonding to bumps 20 (which can be solder bumps or adhesive bumps) deposited on the layers 26 by use of a dispensing process such as screen printing or pneumatic dispensing (step 104). According to one embodiment of the invention, the machine used to deposit the thermally curable material includes a heatable chuck providing a surface on which the wafer is placed.

The bumps 20 are formed of a thermally curable material. After the bumps 20 have been printed or otherwise deposited onto the die bond pads 22, the chuck is heated to cure the deposited material (step 106). Thus, using one system (e.g., screen printing system or pneumatic dispensing system), the thermally curable material can both be deposited on the support structure and heated to cure. This is referred to as in-line formation and curing of thermally curable material on a support structure.

Next, after curing, the wafer is removed from the system and the wafer is sawed to form multiple dies (step 108). A wet adhesive is then screen printed onto the interconnect terminals 12 on the interconnecting substrate 10 (step 110). The die is next face mounted onto the interconnecting substrate 10 such that the bond pads contact corresponding terminals 12 and the wet adhesives are cured (step 112) to bond to the corresponding bumps 20.

Figure 3:
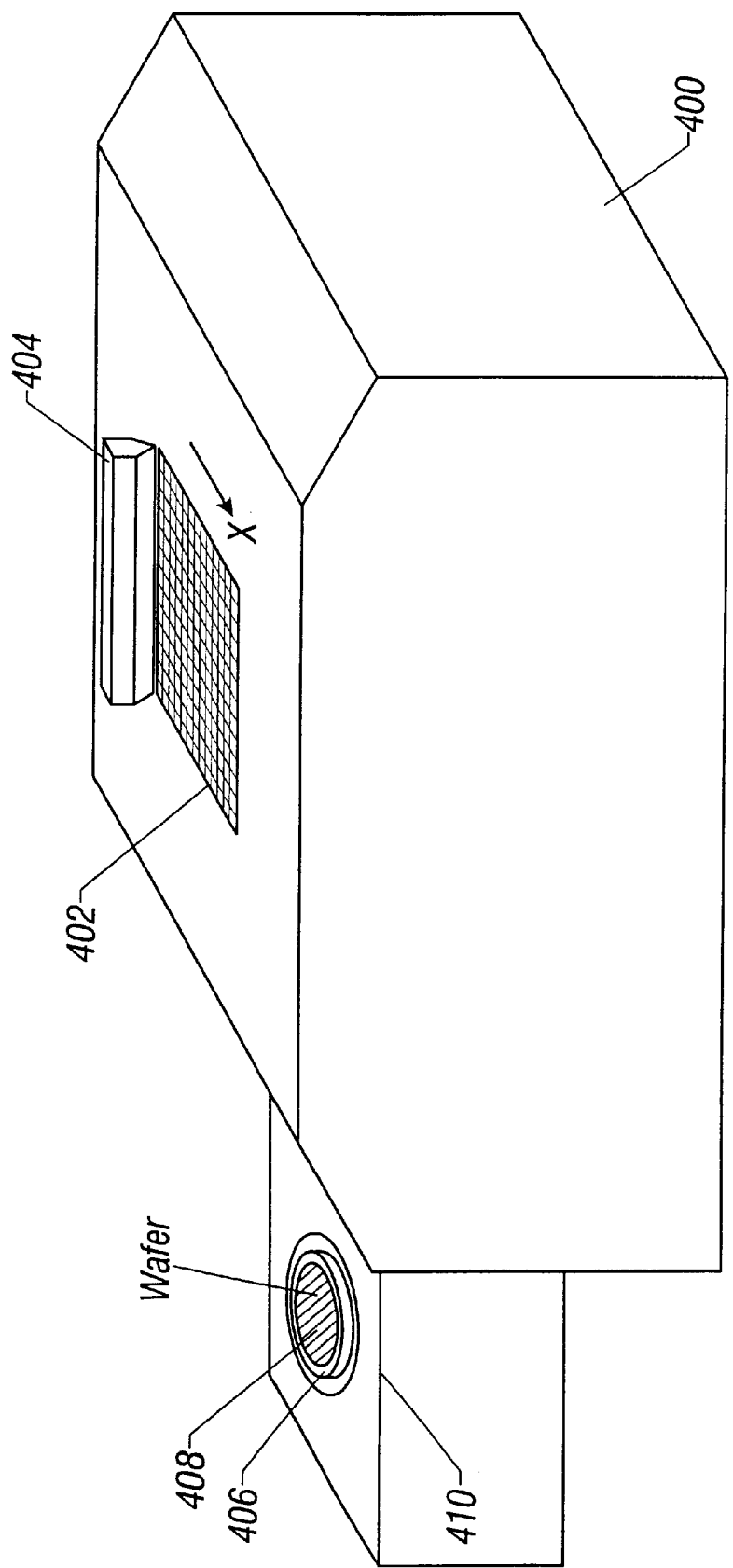
FIG. 3 is a block diagram of a screen printing machine for performing in-line formation and curing of thermally curable materials on a support structure.

The bumps 20 can be deposited onto the bond pads on each die on the wafer using a screen printing machine 400, such as the exemplary system shown in FIG. 3. The screen printing machine 400 can be used with other support structures as well, such as PWBs and other types of interconnecting substrates. The screen printing machine 400 includes a screen 402 (which can be a mesh screen or a metal mask stencil) and a squeegee 404. During screen printing, the squeegee 404 is moved along the direction generally indicated by X over the screen 402. A paste is inserted between the squeegee 404 and the screen 402. The squeegee 404 applies a downward pressure to force the paste through the openings of the screen 402.

The screen printing machine 400 includes a loading surface 410 that provides support for a heatable chuck 406. A wafer 408 can be placed on the chuck 406, which is then loaded into the screen printing machine 400 and positioned under the screen 402. The locations at which paste material is deposited on the wafer is determined by the positions of the openings in the screen 402. Bumps can thus be selectively deposited onto bond pad sites on each die on the wafer 408.

The chuck 406 used in the screen printing machine 400 can be thermally controlled to achieve temperatures within a predetermined range. For example, the AirCool® Thermo Control Chuck from ERS Elektronik GmbH has a temperature range between −10° C. and 200° C. Another exemplary chuck that can be used is the ARCTIC TC Temperature Control Chuck from TRIO-TECH of San Fernando, Calif., which has a temperature range from −65° C. to 300° C.

Once the desired bumps are screen printed onto the bond pad sites on the wafer 408, the chuck 406 is heated to uniformly heat the wafer (step 106 in FIG. 2) to cure the bump material. An exemplary adhesive material used to form the bump is a snap cure adhesive including silver-filled adhesive, such as the QMI 505 from Quantum Materials, Inc., of San Diego, Calif. Using this type of bump, after the chuck 406 and wafer 408 reach 200° C., the bumps on the wafer 408 can be cured within approximately 2 seconds.

Other types of conductive adhesives can be used, including bismaleimide, or conductive thermoplastics and thermoset materials (e.g., epoxy or polyimide) filled with a conductive filler. Solder bumps can also be used, in which case heating the chuck 406 causes the solder bumps to reflow to the desired configuration. As used in this application, thermal curing includes both chemical or physical alteration of the curable material, including altering the chemical characteristics of an adhesive material or reflowing solder.

An in-line curing process in described that uses a heatable chuck in a screen printing system. Alternatively, an infrared radiation (IR) process can also be used to cure the curable materials. Mechanisms to perform IR curing can be included in the screen printing system.

Although the screen printing machine 400 is shown with one chuck, multiple chucks can be provided onto which multiple wafers can be placed. After the bumps are screen printed onto the wafers (using one screen or multiple screens for parallel screen printing), all the chucks can be heated at the same time to perform in-line curing of the bumps deposited onto the die bond pads on the wafers.

Figure 4:
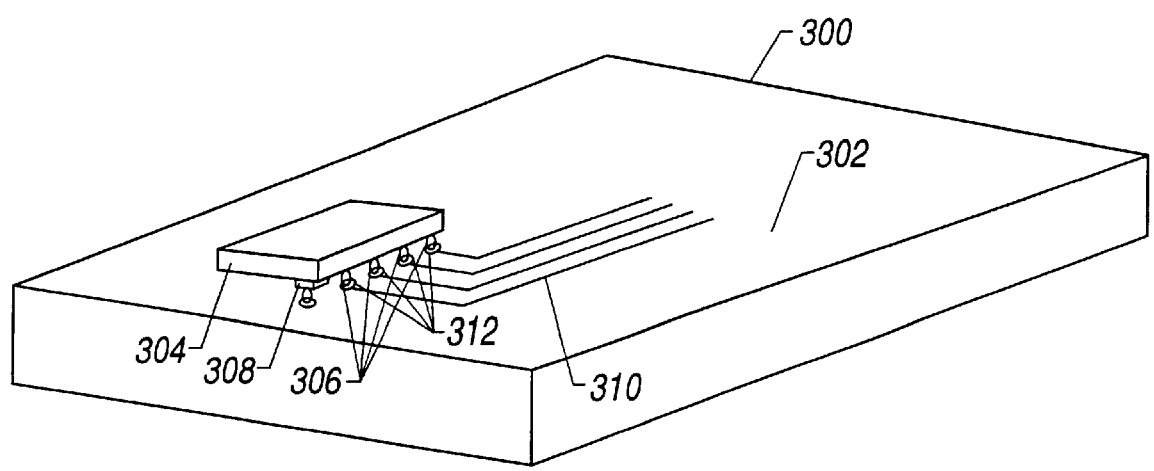
FIG. 4 is a perspective view of a printed wiring board.

The in-line material formation and curing process can be extended to other support structures, including PWBs. Portions of a PWB 300 are shown in FIG. 4. A conductive paste 306 that is thermally curable (e.g., Ag-filled epoxy) can be screen printed onto the bonding pads 312 of the PWB 300 to bond to bonding pads 308 of an integrated circuit device 304. A chuck or other heatable surface sized to receive the PWB is used in the screen printing or pneumatic dispensing machine. The conductive material is then cured using the chuck or other surface heating method. After curing, joints 306 are formed, which connect to conductor lines 310 extending through a layer in the multilayer PWB 300. Alternatively, an IR process can be used to cure the thermally curable material.

Other embodiments are within the scope of the following claims. For example, although specific materials are mentioned in the process described, other materials can be used and still achieve desirable results. The steps of the described process can also be varied. Other support structures that can be used with the described in-line process include interconnecting substrates used to receive chip-on-board devices and ball grid array (BGA) devices.

What is claimed is:

1. A method of forming a thermally curable material on a support structure in an electronic device, the method comprising:

placing the electronic device support structure on a heatable structure in a process chamber;

depositing through a screen to form thermally curable material including a conductive adhesive on a surface of the support structure while it is in the process chamber; and heating the heatable surface to heat the support structure to a temperature sufficient to cure the deposited material while the support structure is still in the process chamber to bond the thermally curable material to the support structure.

2. The method of claim 1, wherein the act of placing comprises placing the support structure including a wafer in the process chamber.

3. The method of claim 1, wherein the act of placing comprises placing the support structure including a printed wiring board in the process chamber.

4. The method of claim 1, wherein the heating includes heating a chuck.

5. The method of claim 1, wherein depositing the thermally curable material includes depositing an adhesive filled with a conductive filler.

6. The method of claim 1, wherein depositing the thermally curable material includes depositing a material selected from the group consisting of a conductive thermoplastic material and a conductive thermoset material.

7. A method of forming bumps on bond pads on a die, comprising:

placing the die on a heatable surface;

forming thermally curable bumps including a conductive adhesive on the bond pads by depositing the thermally curable bumps through a screen; and heating the heatable surface to a temperature sufficient to cure the bumps to bond the bumps to the bond pads.

8. The method of claim 7, wherein the forming includes screen-printing the thermally curable bumps onto the bond pads.

9. The method of claim 7, wherein the acts of forming and heating are performed in one system.

10. The method of claim 9, wherein the acts of forming and heating are performed in a system that includes a screen-printing machine.

11. The method of claim 7, wherein forming the thermally curable bumps includes forming bumps including an adhesive filled with a conductive filler.

12. The method of claim 7, wherein forming the thermally curable bumps includes forming bumps including a material selected from the group consisting of a conductive thermoplastic material and a conductive thermoset material.

13. A method of fabricating a flip-chip assembly, comprising:

depositing through a screen a thermally curable material including a conductive adhesive onto bond pads on a die placed on a heatable surface in a process chamber;

heating the heatable surface to heat the thermally curable material to a sufficient temperature to cure the thermally curable material while the die is still in the process chamber; and face mounting the die onto an interconnecting structure by connecting the cured material on the die bond pads to corresponding terminals on the interconnecting structure.

14. The method of claim 13, wherein the acts of depositing and heating are performed in a single system.

15. The method of claim 14, wherein the acts of depositing and heating are performed in a system that includes a screen printing machine.

16. The method of claim 13, wherein the acts of depositing and heating are performed on the die while it is still part of a wafer.

17. The method of claim 13, wherein depositing the thermally curable material includes depositing an adhesive filled with a conductive filler.

18. The method of claim 13, wherein depositing the thermally curable material includes depositing a material selected from the group consisting of a conductive thermoplastic material and a conductive thermoset material.

* * * * *